United States Patent
Fischer et al.

(10) Patent No.: US 11,699,973 B2
(45) Date of Patent: Jul. 11, 2023

(54) METERING AND CONTROL SUBSYSTEMS FOR PHOTOVOLTAIC SOLAR SYSTEMS

(71) Applicant: SunPower Corporation, San Jose, CA (US)

(72) Inventors: Kevin C. Fischer, Orinda, CA (US); Philip Rothblum, San Jose, CA (US); Donald H. Scrutchfield, Austin, TX (US); Dylan W. Benjamin, San Francisco, CA (US)

(73) Assignee: SunPower Corporation, San Jose, CA (US)

(*) Notice: Subject to any disclaimer, the term of this patent is extended or adjusted under 35 U.S.C. 154(b) by 291 days.

(21) Appl. No.: 15/987,856

(22) Filed: May 23, 2018

(65) Prior Publication Data

US 2019/0363672 A1    Nov. 28, 2019

(51) Int. Cl.
*H02S 50/00* (2014.01)
*H02H 7/20* (2006.01)
(Continued)

(52) U.S. Cl.
CPC ........ *H02S 50/00* (2013.01); *G01R 19/16571* (2013.01); *H02H 1/0007* (2013.01);
(Continued)

(58) Field of Classification Search
CPC .......... H02S 50/00; H02S 50/10; H02S 50/15; H02S 40/00; H02S 40/30; H02S 40/34; H02S 40/36; G01R 19/165; G01R 19/16504; G01R 19/16509; G01R 19/16566; G01R 19/16571; G01R 31/327; G01R 31/3275; G01R 31/3278;
(Continued)

(56) References Cited

U.S. PATENT DOCUMENTS 5,627,737 A * 5/1997 Maekawa ......... H02M 7/53871
                                                363/40
8,581,441 B2   11/2013 Rotzoll et al.
(Continued)

OTHER PUBLICATIONS

"Adjustable Current Sensing Relay, 240VAC Input Voltage, 10.00A Contact Amps, Contact Form: 1NO," Grainger, https://www.grainger.com/product/JOHNSON-CONTROLS-Adjustable-Current-Sensing-36P574?breadcrumbCatId=3356&functionCode=P2IDP2PCP, pp. 1-4 (2018).
(Continued)

*Primary Examiner* — Thienvu V Tran
*Assistant Examiner* — Carlos O Rivera-Perez
(74) *Attorney, Agent, or Firm* — Jenkins, Wilson, Taylor & Hunt, P.A.

(57) ABSTRACT

A metering and control subsystem for a photovoltaic solar system is configured for metering the photovoltaic solar system using current measurement devices and individually controlling relays to selectively energize photovoltaic branch circuits. In some examples, the metering and control subsystem includes photovoltaic branch connectors, a relay matrix, current measurement devices, and a metering and relay control circuit. The metering and control circuit is configured for metering the photovoltaic solar system using current measurement data from the current measurement devices and individually controlling the relays to selectively energize each photovoltaic branch circuit.

5 Claims, 6 Drawing Sheets

(51) Int. Cl.
  *G01R 19/165*  (2006.01)
  *H02S 40/36*  (2014.01)
  *H02S 40/34*  (2014.01)
  *H02H 1/00*  (2006.01)
  *H02J 3/38*  (2006.01)

(52) U.S. Cl.
  CPC .............. *H02H 7/20* (2013.01); *H02J 3/381* (2013.01); *H02S 40/34* (2014.12); *H02S 40/36* (2014.12); *H02J 2300/24* (2020.01)

(58) Field of Classification Search
  CPC ...... G01R 22/00; G01R 22/10; G01R 22/061; G01R 22/063; G01R 22/068; G01R 22/08; H02H 1/00; H02H 1/0007; H02H 1/04; H02H 1/043; H02H 7/20; H02H 3/04; H02H 3/087; H02J 3/06; H02J 3/38; H02J 3/381; H02J 3/382; H02J 3/383; H02J 3/388; H02J 2300/24; H02M 7/00; H02M 7/42; H02M 7/44; H02M 7/48; H02M 7/515; H02M 7/521; H02M 7/537; H02M 7/5387; H02M 1/32; H02M 1/36; Y02B 10/10; Y02B 10/56
  USPC ... 361/18, 42, 44, 46–50, 59, 63–66, 78, 79, 361/87, 93.1, 93.2, 93.4–93.7, 93.9, 361/100–102, 109, 114, 115, 160, 166, 361/170, 171, 187, 196, 197, 206; 363/50, 55–56.12, 65, 71–72, 95–98, 106, 363/120, 121, 123, 131–134, 146; 323/271–278, 282–285, 351, 906, 908
  See application file for complete search history.

(56) References Cited

U.S. PATENT DOCUMENTS

| | | |
|---|---|---|
| 8,626,616 B2 | 1/2014 | Eich |
| 8,847,614 B2 | 9/2014 | DeBone et al. |
| 9,742,188 B2 | 8/2017 | Georgopapadakos et al. |
| 9,906,036 B2 | 2/2018 | Chapman |
| 9,985,582 B2 | 5/2018 | Uebel et al. |
| 10,466,282 B2 | 11/2019 | Uebel et al. |
| 10,523,010 B2 | 12/2019 | Murugesan et al. |
| 10,969,414 B2 | 4/2021 | Scrutchfield et al. |
| 2014/0211345 A1 | 7/2014 | Thompson et al. |
| 2015/0001964 A1 | 1/2015 | Duda et al. |
| 2016/0036234 A1 | 2/2016 | Del Olmo et al. |
| 2016/0036372 A1 | 2/2016 | Hoepfner et al. |
| 2016/0036373 A1 | 2/2016 | Hoepfner et al. |
| 2016/0036381 A1 | 2/2016 | Kromer et al. |
| 2017/0030950 A1 | 2/2017 | Uebel et al. |
| 2017/0077710 A1 | 3/2017 | Duda et al. |
| 2017/0110873 A1* | 4/2017 | Glovinski ............... H02S 40/30 |
| 2017/0288599 A1 | 10/2017 | Chapman et al. |
| 2017/0346293 A1 | 11/2017 | Chapman et al. |
| 2019/0341882 A1 | 11/2019 | Fischer et al. |

OTHER PUBLICATIONS

"What else could we teach a circuit breaker to do?", Eaton—Powering Business Worldwide, http://www.eaton.com/FTC/utilities/EMCB/index.htm, pp. 1-11 (2017).

"Monitoring relays," Phoenix Contact, https://www.phoenixcontact.com/online/portal/us?1dmy&urile=wcm:path:/usen/web/main/products/subcategory_pages/Monitoring_relays_P-14-14-04/c1b8ace6-9bab-4f10-bbb6-c13d0db30be5, pp. 1-2 (2018).

"Power Monitoring and Power Control Products," Schneider Electric, https://www.schneider-electric.com/en/product-category/4100-power-monitoring-and-control/, pp. 1-15 (2018).

"Power Monitoring Relay," Allen-Bradley, http://ab.rockwellautomation.com/Circuit-and-Load-Protection/Supplementary-Motor-Protectors/Monitoring-Relays/Power-Monitors, pp. 1 (2018).

"LCR-5 Auxiliary Load Control Relay," Solid State Instruments, http://solidstateinstruments.com/productpages/lcr-5-load-control-relay.php, pp. 1-6 (2018).

St. John, Smart Circuit Breakers: The Next Frontier of the Grid Edge?, GTM, https://www.greentechmedia.com/articles/read/smart-circuit-breakers-the-next-frontier-of-the-grid-edge#gs.5ONTZK4, pp. 1-6 (2017).

* cited by examiner

METERING AND CONTROL SUBSYSTEMS FOR PHOTOVOLTAIC SOLAR SYSTEMS

BACKGROUND

The subject matter described in this specification relates generally to photovoltaic solar systems and metering and control subsystems for photovoltaic solar systems.

Photovoltaic cells are devices for converting solar radiation into electrical energy. Photovoltaic cells can be assembled into solar modules, which may be used to convert sunlight into electricity. A photovoltaic solar system typically includes multiple solar modules, one or more inverters, and interconnection wiring.

Photovoltaic solar electrical generation systems produce electrical energy that can supplement electrical power that is provided from a utility company. Monitoring of power within this photovoltaic solar system is typically performed with metering data that is obtained from measurement of electrical energy at the installation site. Metering functions that produce photovoltaic generation performance, as well as power consumed by the customer, depend on measurement of current and voltage.

SUMMARY

A metering and control subsystem for a photovoltaic solar system is configured for metering the photovoltaic solar system using current measurement devices and individually controlling relays to selectively energize photovoltaic branch circuits. In some examples, the metering and control subsystem includes photovoltaic branch connectors each configured for coupling to a respective photovoltaic branch circuit. Each photovoltaic branch circuit includes one or more inverters each coupled to a respective photovoltaic solar module of the photovoltaic solar system.

The metering and control subsystem includes a relay matrix including, for each photovoltaic branch circuit, a relay coupled to the photovoltaic branch circuit. The metering and control subsystem includes current measurement devices, one for each photovoltaic branch circuit, and each current measurement device is coupled to a respective relay of the relay matrix. Each current measurement device is configured to measure current flowing through the relay.

The metering and control subsystem includes a metering and relay control circuit coupled to the relay matrix and the current measurement devices. The metering and control circuit is configured for metering the photovoltaic solar system using current measurement data from the current measurement devices and individually controlling the relays to selectively energize each photovoltaic branch circuit. The metering and control subsystem includes an interface connector for coupling the metering and control circuit to a photovoltaic supervisor system configured for communicating with the inverters of the photovoltaic solar system.

The subject matter described in this specification may be implemented in hardware, software, firmware, or combinations of hardware, software and/or firmware. In some examples, the subject matter described in this specification may be implemented using a non-transitory computer readable medium storing computer executable instructions that when executed by one or more processors of a computer cause the computer to perform operations. Computer readable media suitable for implementing the subject matter described in this specification include non-transitory computer-readable media, such as disk memory devices, chip memory devices, programmable logic devices, random access memory (RAM), read only memory (ROM), optical read/write memory, cache memory, magnetic read/write memory, flash memory, and application specific integrated circuits. In addition, a computer readable medium that implements the subject matter described in this specification may be located on a single device or computing platform or may be distributed across multiple devices or computing platforms.

DETAILED DESCRIPTION

Figure 1:
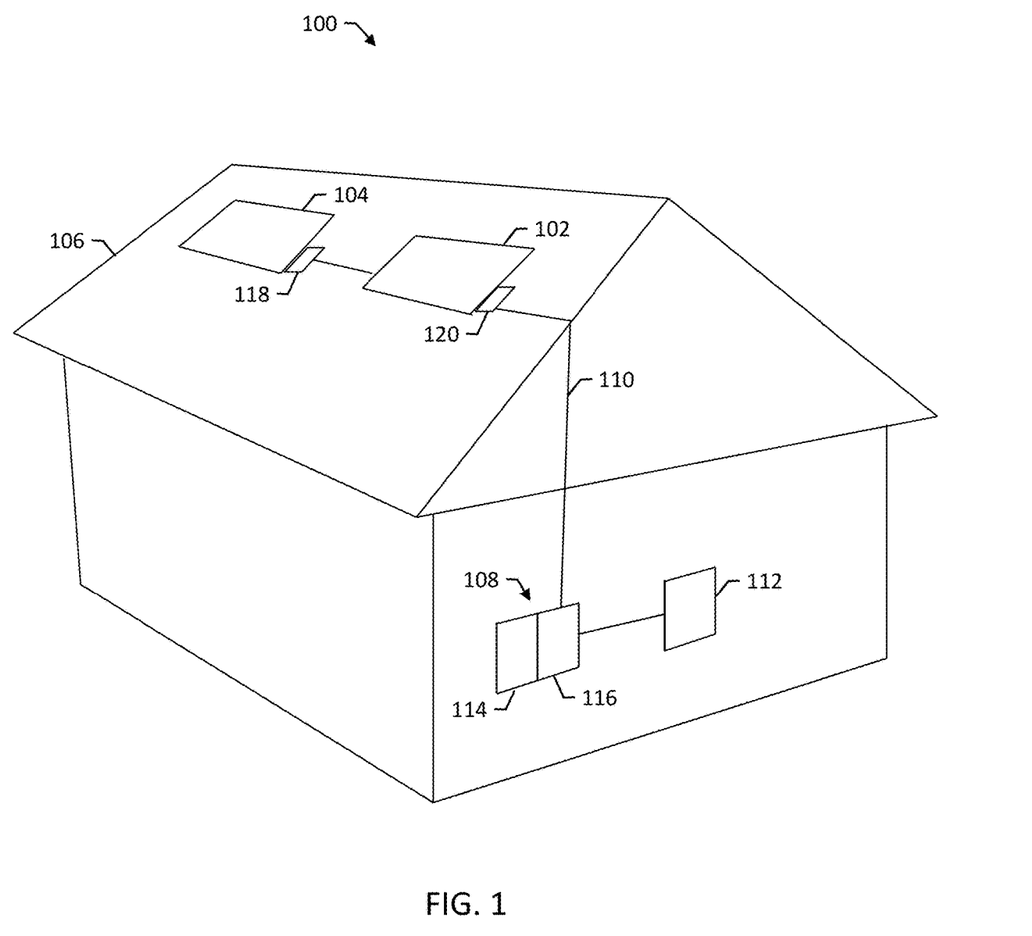
FIG. 1 is a diagram of an example photovoltaic solar system.

FIG. 1 is a diagram of an example photovoltaic solar system 100. The system 100 includes a number of photovoltaic solar modules 102 and 104 mounted on a roof 106 of a building. Each of the photovoltaic solar modules 102 and 104 is comprised of one or more photovoltaic cells, e.g., arranged in a frame. The photovoltaic solar modules 102 and 104 are chained together and electrically coupled to a control system 108 by interconnection wiring 110. The control system 108 is then electrically coupled to one or more electric components 112, e.g., an electric panel or a solar connection device coupled to an electric panel.

The control system 108 includes a metering and control subsystem 116 and a photovoltaic supervisor system 114. The photovoltaic supervisor system 114 is a computing system configured, by virtue of appropriate programming, to monitor the photovoltaic solar system 100 and perform one or more actions based on the monitoring. The photovoltaic supervisor system 114 is configured for communicating with and controlling one or more inverters.

For example, suppose that the photovoltaic solar modules 102 and 104 are coupled to corresponding inverters 118 and 120. The photovoltaic supervisor system 114 can be configured to communicate with the inverters 118 and 120 using a power line communication (PLC) system over interconnection wiring 110. For example, the photovoltaic supervisor system 114 can transmit commands to the inverters 118 and 120 to decrease power output.

In some examples, the photovoltaic supervisor system 114 transmits metering data to a remote system, e.g., a homeowner's computer system, a building manager's computer system, or a solar panel manufacturer or installer computer system. The photovoltaic supervisor system 114 can meter the photovoltaic solar system 100 using the metering and control subsystem 116, which includes metering circuits and a controllable relay matrix. The metering and control subsystem 116 is configured for metering the photovoltaic solar system 100 and individually controlling the relays of the relay matrix to selectively energize photovoltaic branch circuits of the photovoltaic solar system 100.

The photovoltaic supervisor system 114 and the metering and control subsystem 116 can be enclosed in a weatherproof housing for outdoor installation. In some examples, the photovoltaic supervisor system 114 and the metering and control subsystem 116 are housed separately and connected by cables.

The photovoltaic solar system 100 can be configured, by virtue of the photovoltaic supervisor system 114 and the metering and control subsystem 116, to perform the following functions reliably and affordably:

Allow No-Touch commissioning with possibly extensive system parameter discovery

Figure 2:
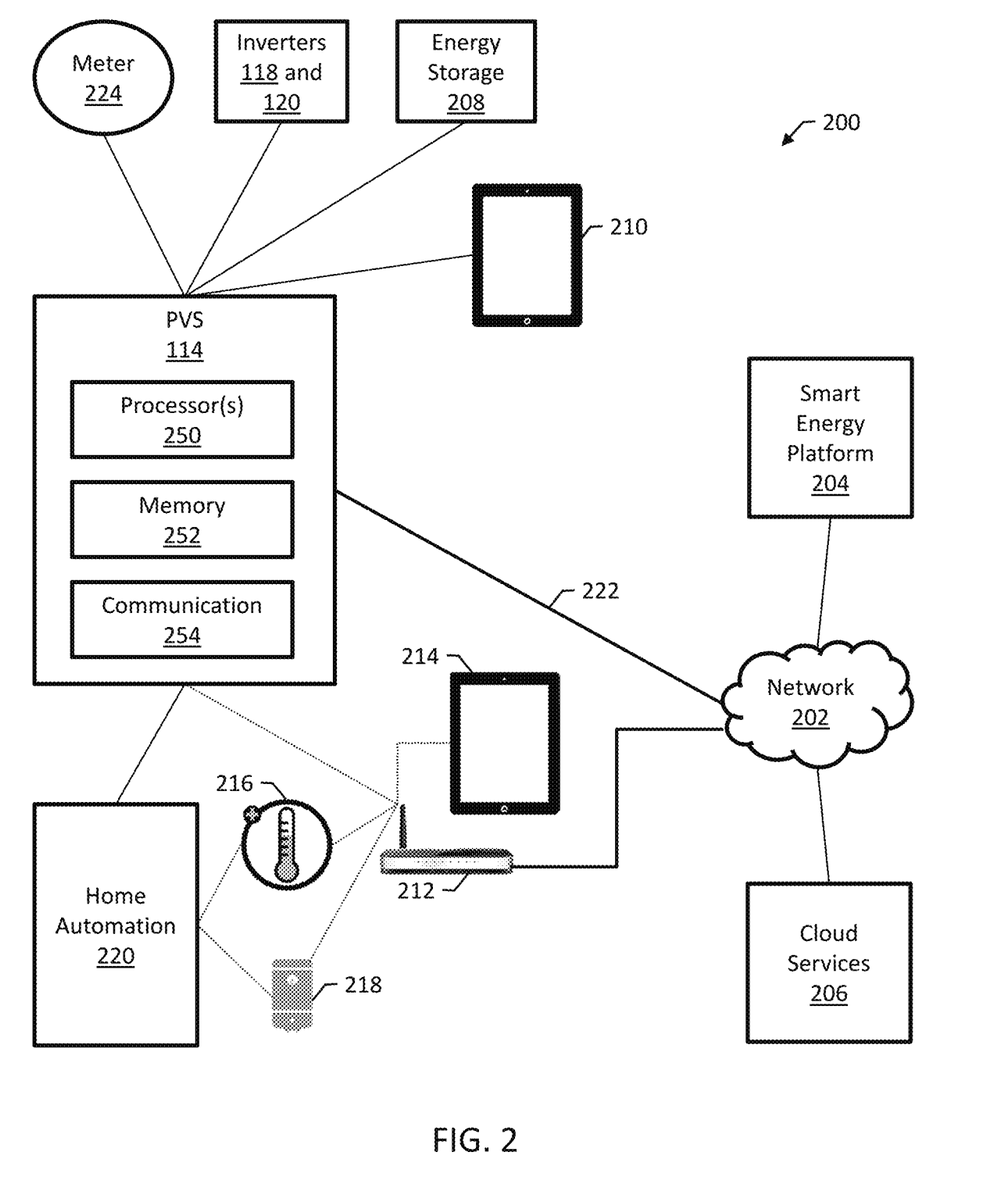
FIG. 2 is a block diagram of an example environment for a photovoltaic supervisor system.

Allow nameplate rating control, e.g., to increase or maximize system output on a 40 Amp circuit, with resettable overcurrent shutdown Provide AC Shutdown capability, with utility lockout Reduced size, weight, power consumption, and/or cost compared to some other systems such as smart circuit breakers FIG. 2 is a block diagram of an example environment 200 for the photovoltaic supervisor system 114. The photovoltaic supervisor system 114 communicates over a data communications network 202, e.g., the Internet, with a remote system 204 executing on a system of one or more computers and/or one or more computer servers 206 providing cloud computing services related to energy monitoring and management. The photovoltaic supervisor system 114 can be implemented with one or more processors 250, memory 252 storing executable instructions for the processors, and a data communications system 254 including, e.g., a Wi-Fi communications circuit and a PLC circuit. Other communication approaches can be used including radio, hard wire communications etc.

The photovoltaic supervisor system 114 communicates, either directly or over a data communications network, with one or more optional components of the system, including a consumption meter 224, which can be a smart meter; one or more inverters 118 and 120, which can include microinverters and/or string inverters that are each configured to couple to a string of solar cells; an energy storage device 208, e.g., one or more batteries and a control system of one or more computers; a commissioning device 210, e.g., a tablet computer or other appropriate computing device used to verify properties of a solar system after installation; and a wireless access point 212 for accessing, e.g., a local area network (LAN).

The photovoltaic supervisor system 114 can communicate, using the wireless access point 212, with a customer device 214 such as a tablet computer; the remote system 204 and the cloud services servers 206 using the network 202; a smart thermostat 216; one or more controllable electric loads 218; and a home automation system 220. The home automation system 220 can include one or more computers providing one or more services such a personal safety applications and appliance control applications. The photovoltaic supervisor system 114 can transmit system status data, including metering data and other data such as the number of inverters on each branch circuit of a number of photovoltaic branch circuits.

In operation, the photovoltaic supervisor system 114 can take energy measurements and transmit the energy measurements to the remote system 204. The photovoltaic supervisor system 114 can transmit the energy measurements to other systems, e.g., the cloud services server 206, which can be configured to provide computing services for, e.g., home automation. In some examples, the remote system 204 and/or the cloud services server 206 can be configured for remote configuration modification and troubleshooting of the photovoltaic supervisor system 114, e.g., using a cloud-hosted web application.

Figure 3:
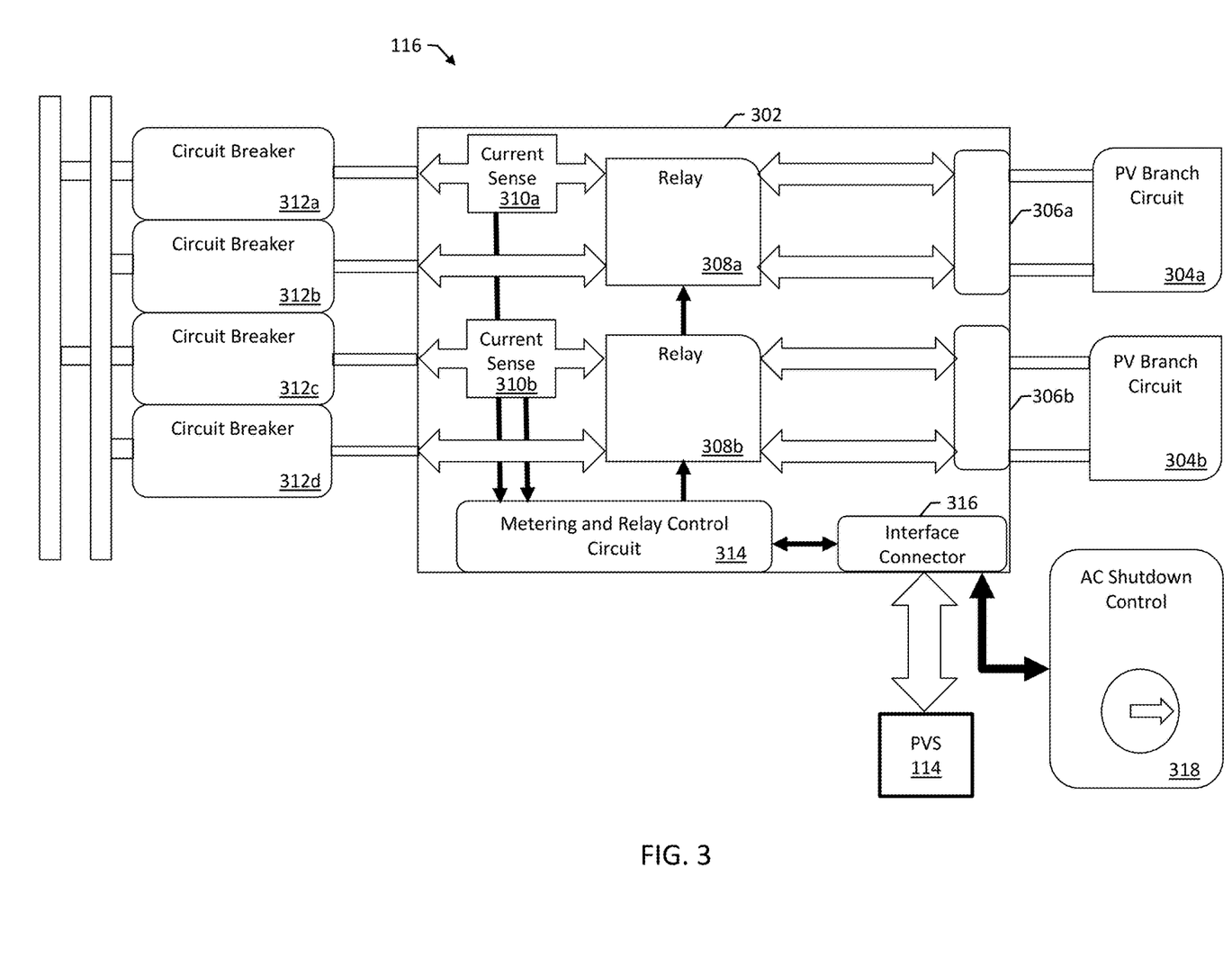
FIG. 3 is a block diagram of a metering and control subsystem.

FIG. 3 is a block diagram of the metering and control subsystem 116. The metering and control subsystem 116 can include at least one circuit board 302 housing a number of electric components and connected to a number of photovoltaic branch circuits 304a-b. Each of the photovoltaic branch circuits 304a-b includes one or more photovoltaic solar modules and one or more inverters. The circuit board 302 includes a number of photovoltaic branch connectors 306a-b, e.g., terminal blocks, each coupled to a respective photovoltaic branch circuit.

The circuit board 302 includes a relay matrix including, for example, photovoltaic branch circuit, a relay 308a-b coupled to the photovoltaic branch connector 306a-b. The circuit board 302 includes current measurement devices 310a-b, one for each of the photovoltaic branch circuits 304a-b. Each of the current measurement devices 310a-b is coupled to one of the relays 308a-b, and each of the current measurement devices 310a-b is configured to measure current flowing through the corresponding relay. For example, the current measurement devices 310a-b can be current transformers (CTs).

The metering and control subsystem 116 includes a number of circuit breakers 312a-d coupled to outputs of the current measurement devices 310a-b and the relays 308a-b. The circuit breakers 312a-d can be simple circuit breakers mounted on a DIN rail for a homeowner or building manager to manually control. Typically, the circuit breakers 312a-d are implemented to meet electrical standards for circuit breakers set by a standards setting organization.

The circuit board 302 includes a metering and relay control circuit 314 coupled to the relays 308a-b and the current measurement devices 310a-b. The metering and relay control circuit 314 is configured for metering the photovoltaic solar system 100 using current measurement data from the current measurement devices 310a-b. The metering and relay control circuit 314 is also configured for individually controlling the relays to selectively energize each photovoltaic branch circuit 304a-b.

The circuit board 302 includes an interface connector 316 for coupling the metering and relay control circuit 314 to the photovoltaic supervisor system 114. The metering and relay control circuit 314 can transmit metering data to the photovoltaic supervisor system 114 over the interface connector 316, and the metering and relay control circuit 314 can receive commands for controlling the relays 308a-b over the interface connector 316.

The metering and control subsystem 116 can optionally include a dedicated AC shutdown control switch 318. The AC shutdown control switch 318 can extend through a housing for the metering and control subsystem 116, and the switch 318 can be painted brightly for easy identification, e.g., by emergency workers. The switch 318 can be wired directly into the interface connector 316. When the switch 318 is thrown into the shutdown position, the relays 308a-b de-energize all of the photovoltaic branch circuits 304a-b.

In operation, the metering and relay control circuit 314 is configured to prevent overcurrent situations on the photovoltaic branch circuits 304a-b. The metering and relay control circuit 314 is configured for using the current measurement data to determine that the current flowing through one of the photovoltaic branch circuits exceeds a threshold current and, in response, cause an overcurrent shutdown by controlling the relay to de-energize the photovoltaic branch circuit coupled to the relay.

In some examples, the metering and control subsystem 116 is configured for use with an electric system (e.g. split-phase). Each of the photovoltaic branch circuit connectors 306a-b includes two conductors for carrying two phases of alternating current from one of the photovoltaic branch circuits 304a-b. Then, each of the relays 308a-b can be implemented as a normally-open double-pole single-throw relay coupled to the two conductors of the photovoltaic branch connector and configured to open the relay in the absence of a control signal from the metering and relay control circuit 314.

In the case of a electric system, the metering and control subsystem 116 may only use one current measurement device for each photovoltaic branch circuit, since measuring one of the phases is sufficient for metering the branch. The metering and control subsystem 116 may, however, include circuit breakers 312a-d for both phases of each of the photovoltaic branch circuits 304a-b.

In some examples, the metering and control subsystem 116 is configured to perform, or support the photovoltaic supervisor system 114 in performing, remote shutdown of the photovoltaic solar system with no-touch/remote re-enabling, e.g., to allow for remote lease lockout. The metering and control subsystem 116 can be configured to support the photovoltaic supervisor system 114 to measure current on each photovoltaic branch circuit and dial back inverters on appropriate photovoltaic branch circuits to protect the circuit, curtail system production and/or optimize system performance. Since the metering and control subsystem 116 can perform metering, the photovoltaic supervisor system 114 can be remotely updated, e.g., by firmware upgrade, without comprising safety-related programming, e.g., safety firmware used on the metering and control subsystem 116.

In some examples, the metering and control subsystem 116 includes indicators for system troubleshooting. For example, the metering and control subsystem 116 can include one or more light emitting diodes (LEDs) or other light sources to indicate system status. The metering and control subsystem 116 can light one or more LEDs in response to causing an overcurrent shutdown.

Figure 4A:
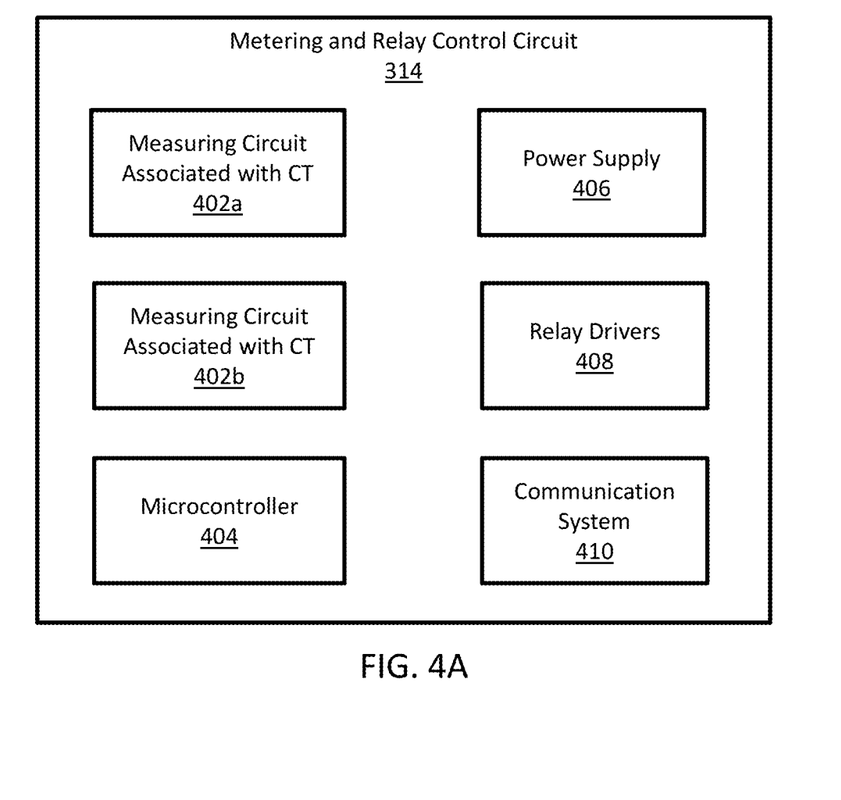
FIGS. 4A-D further illustrate the metering and control subsystem.

FIGS. 4A-D further illustrate the metering and control subsystem 116. FIG. 4A is a block diagram of the metering and relay control circuit 314. The metering and relay control circuit 314 includes measuring circuits 402a-b, one for each of the photovoltaic branch circuits 304a-b. The measuring circuits 402a-b are each coupled to a respective current measurement device and can be implemented using, e.g., digital signal processors.

The metering and relay control circuit 314 includes a microcontroller 404, a power supply 406, relay drivers 408, and a communication system 410. The power supply 406 can provide power to the other components of the metering and relay control circuit 314. The relay drivers 408 provide control signals to the relays 308a-b to cause the relays 308a-b to open and close. The communication system 410 can be, e.g., a universal asynchronous receiver-transmitter (UART) circuit.

Figure 4B:
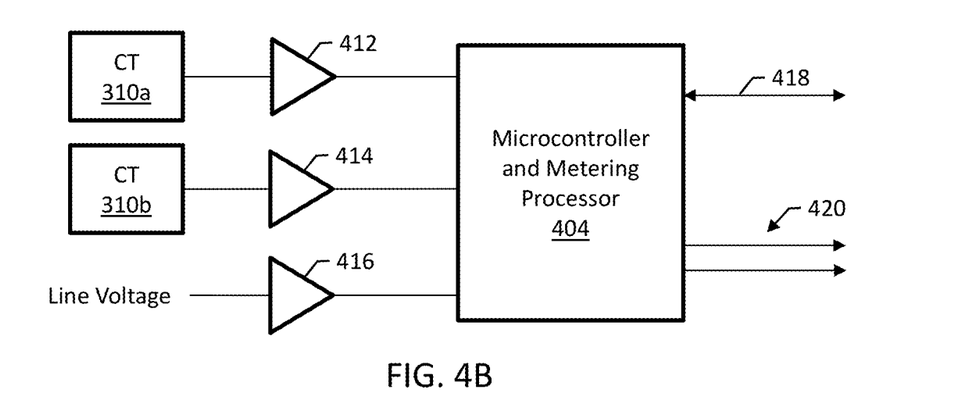

FIG. 4B illustrates an example configuration of the microcontroller 404 where the microcontroller 404 is configured to act as a metering processor, i.e., to perform metering calculations. The microcontroller 404 receives analog data from electronics 412 and 414 coupled to the CTs 310a-b, and the microcontroller communicates serial commands 418 and control outputs 420 to relays.

Figure 4C:
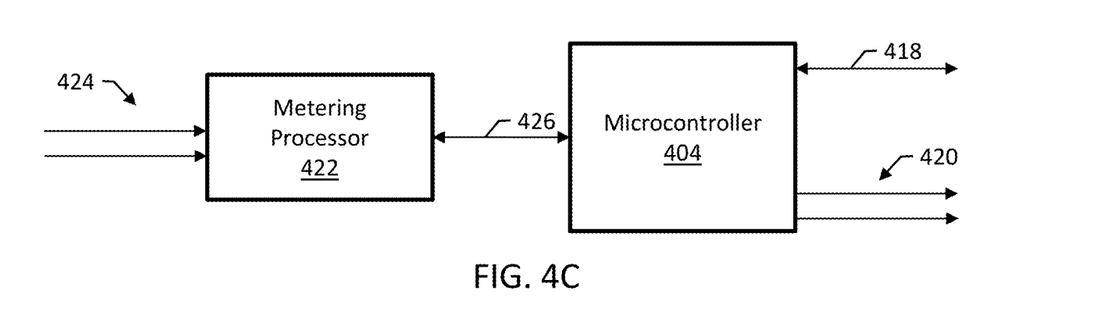

FIG. 4C illustrates an alternative example configuration of the microcontroller 404. A metering processor 422 receives analog data 424 and provides digital metering data 426 to the microcontroller 404. The microcontroller 404 can be programmed to read the metering data from the metering processor 422, which may be stored, e.g., in digital registers.

The microcontroller 404 may periodically read the metering data or may read the metering data in response to a command received using the communication system. The microcontroller 404 can be programmed to transmit the metering data using the communication system 410.

The metering and control subsystem 116 can operate autonomously or semi-autonomously from the photovoltaic supervisor system 114. The metering and control subsystem 116 can be programmed to automatically disconnect the PV system based on a pre-determined fault threshold.

In an implementation, the microcontroller 404 can be programmed to receive relay control commands from the photovoltaic supervisor system 114 using the communication system 410. For example, the microcontroller 404 can receive a command from the photovoltaic supervisor system 114 to energize one of the photovoltaic branch circuits and de-energize all of the other photovoltaic branch circuits. In response to receiving the command, the microcontroller 404 controls the relay drivers 408 to carry out the command.

Figure 4D:
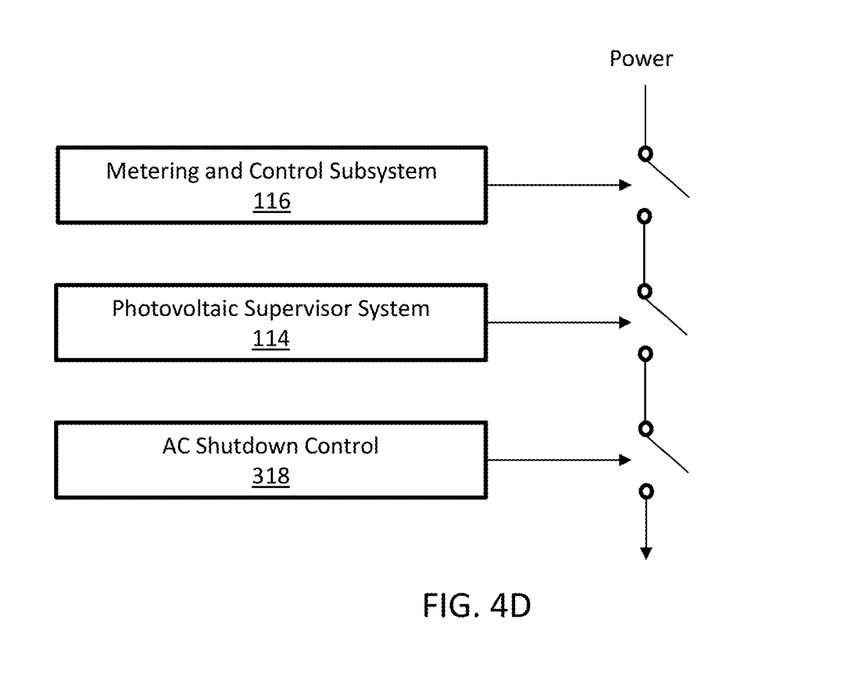

In some implementations, the metering and control subsystem 116 is configured to operate autonomously from the photovoltaic supervisor system 114. FIG. 4D illustrates the flow of power through the metering and control subsystem 116, the photovoltaic supervisor system 114, and the AC shutdown control 318. The metering and control subsystem 116 can independently disconnect the power based on, e.g., detection of a fault. Similarly, the photovoltaic supervisor system 114 and the AC shutdown control can each independently disconnect the power.

Figure 5:
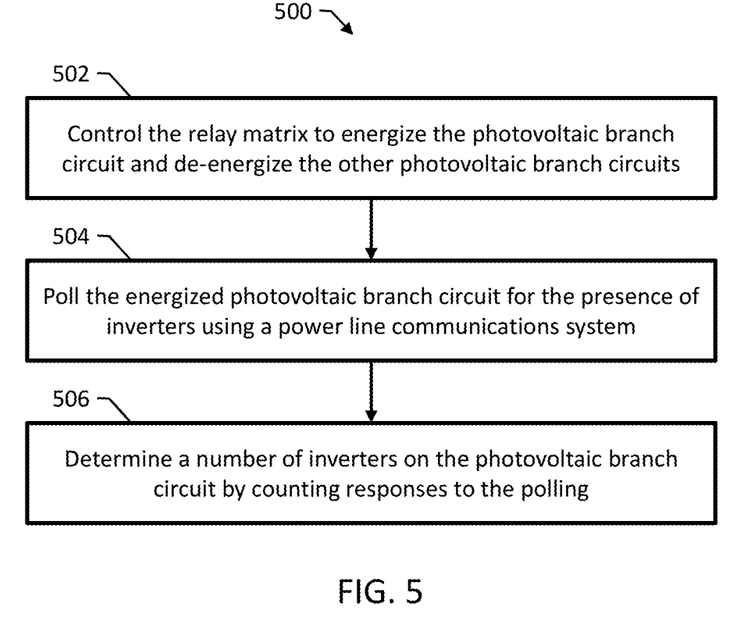
FIG. 5 is a flow chart of an example method for determining the number of inverters on a photovoltaic branch circuit.

FIG. 5 is a flow chart of an example method 500 for determining the number of inverters on a photovoltaic branch circuit. The method 500 can be performed by the photovoltaic supervisor system 114 working in concert with the metering and control subsystem 116, and the method 500 can be repeated for each photovoltaic branch circuit.

The method 500 includes controlling a relay matrix, e.g., the relays 308a-b of FIG. 3, to energize the photovoltaic branch circuit and de-energize the other photovoltaic branch circuits (502). The method 500 includes polling the photovoltaic branch circuit for the presence of inverters using a (PLC) system (504). The method 500 includes determining a number of inverters on the photovoltaic branch circuit by counting a number of responses to the polling (506). The method 500 can include comparing the number of inverters on each photovoltaic branch circuit to an expected number of inverters and transmitting a result of the comparing to a remote computer system.

In some examples, the method 500 includes other management operations performed by the photovoltaic supervisor system 114 working in concert with the metering and control subsystem 116. For example, the method 500 can include receiving current measurement data for each photovoltaic branch circuit and using the current measurement data to determine that current flowing through one of the photovoltaic branch circuits exceeds a threshold current. Then, the method 500 includes, in response, controlling one or more inverters in that photovoltaic branch circuit to reduce power production from the at least one photovoltaic branch circuit. The photovoltaic supervisor system 114 can control the inverters using the PLC system.

In another example, the method 500 can include receiving current measurement data for each photovoltaic branch circuit and using the current measurement data to determine that current flowing through at least one of the photovoltaic branch circuits exceeds a threshold current. Then, the method 500 includes, in response, controlling the relay matrix to de-energize the at least one photovoltaic branch circuit. The metering and relay control circuit 314 can control the relay matrix.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A metering and control subsystem for a photovoltaic solar system, the metering and control subsystem comprising:
    a plurality of photovoltaic branch connectors each configured for coupling to a respective photovoltaic branch circuit, wherein each photovoltaic branch circuit comprises one or more inverters each coupled to a respective photovoltaic solar module of the photovoltaic solar system;
    a relay matrix comprising, for each photovoltaic branch circuit, a relay coupled to the photovoltaic branch circuit;
    a plurality of current measurement devices, one for each photovoltaic branch circuit, wherein each current measurement device is coupled to a respective relay of the relay matrix, and wherein each current measurement device is configured to measure current flowing through the relay;
    a metering and relay control circuit coupled to the relay matrix and the current measurement devices, wherein the metering and relay control circuit is configured for metering the photovoltaic solar system using current measurement data from the current measurement devices and individually controlling the relays to selectively energize each photovoltaic branch circuit; and
    an interface connector for coupling the metering and control circuit to a photovoltaic supervisor system configured for communicating with the inverters of the photovoltaic solar system;
    wherein the metering and relay control circuit is configured for using the current measurement data to determine that the current flowing through at least one of the photovoltaic branch circuits exceeds a threshold current and, in response, cause an overcurrent shutdown by controlling a corresponding relay to de-energize the photovoltaic branch circuit;
    wherein the metering and relay control circuit is configured for receiving relay control commands from the photovoltaic supervisor system using the interface connector and individually controlling the relays based on the relay control commands; and
    wherein each current measurement device is coupled to a respective relay of the relay matrix by a first node of the current measurement device, and wherein the metering and control subsystem comprises, for each photovoltaic branch circuit, at least one circuit breaker coupled to a second node of the current measurement device for the photovoltaic branch circuit; and
    wherein the metering and control subsystem comprises a dedicated alternating current (AC) shutdown switch configured to de-energize all of the photovoltaic branch circuits.

2. The metering and control subsystem of claim 1, wherein the dedicated AC shutdown switch extends through a housing for the metering and control subsystem, and wherein the dedicated AC shutdown switch is wired directly into the interface connector.

3. The metering and control subsystem of claim 1, wherein each photovoltaic branch circuit connector includes two conductors for carrying two phases of alternating current from a respective photovoltaic branch circuit, and wherein the relay matrix includes, for each photovoltaic branch circuit, a normally-open double-pole single-throw relay coupled to the two conductors of the photovoltaic branch connector and configured to open the relay in the absence of a control signal from the metering and relay control circuit.

4. The metering and control subsystem of claim 1, wherein the metering and relay control circuit comprises a plurality of metering circuits, one for each current measurement device, and a microcontroller configured to read current measurement values from the metering circuits and transmit metering data to the photovoltaic supervisor system using the interface connector.

5. The metering and control subsystem of claim 1, comprising an enclosure housing the relay matrix, the current measurement devices, and the metering and relay control circuit.

* * * * *